(12) United States Patent
Kal et al.

(10) Patent No.: US 11,715,643 B2
(45) Date of Patent: Aug. 1, 2023

(54) GAS PHASE ETCH WITH CONTROLLABLE ETCH SELECTIVITY OF METALS

(71) Applicant: Tokyo Electron Limited, Tokyo (JP)

(72) Inventors: Subhadeep Kal, Albany, NY (US); Daisuke Ito, Hillsboro, OR (US); Matthew Flaugh, Albany, NY (US); Yusuke Muraki, Yamanashi (JP); Aelan Mosden, Hopewell Junction, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/890,141

(22) Filed: Jun. 2, 2020

(65) Prior Publication Data
US 2021/0020454 A1 Jan. 21, 2021

Related U.S. Application Data

(60) Provisional application No. 62/875,658, filed on Jul. 18, 2019.

(51) Int. Cl.
| | | |
|---|---|---|
| H01L 21/3213 | (2006.01) | |
| C23F 1/12 | (2006.01) | |
| C23F 1/02 | (2006.01) | |
| H01L 21/66 | (2006.01) | |
| H01L 21/306 | (2006.01) | |
| H01L 21/02 | (2006.01) | |

(52) U.S. Cl.
CPC ......... *H01L 21/32135* (2013.01); *C23F 1/02* (2013.01); *C23F 1/12* (2013.01); *H01L 21/30621* (2013.01); *H01L 21/32136* (2013.01); *H01L 21/32138* (2013.01); *H01L 22/12* (2013.01); *H01L 21/0228* (2013.01)

(58) Field of Classification Search
CPC ......... H01L 21/32135; H01L 21/30621; H01L 22/12; H01L 21/32136; H01L 21/32138; H01L 21/0228; C23F 1/12; C23F 1/02
See application file for complete search history.

(56) References Cited

U.S. PATENT DOCUMENTS 5,922,219 A * 7/1999 Fayfield ............ H01L 21/31116
216/58
2013/0270227 A1* 10/2013 Guha ................. H01L 43/12
216/51

(Continued)

FOREIGN PATENT DOCUMENTS

| EP | 0354669 A2 | * | 2/1990 | .......... H01J 37/3244 |
| WO | WO97/15069 | * | 4/1997 | ............. H01L 21/00 |
| WO | WO2018180655 | * | 10/2018 | ........... H01L 21/302 |

OTHER PUBLICATIONS

International Search Report issued in Application No. PCT/US2020/035668, dated Sep. 23, 2020 (3 pages).

*Primary Examiner* — Jiong-Ping Lu
(74) *Attorney, Agent, or Firm* — Weihrouch IP

(57) ABSTRACT

A method for the dry removal of a material on a microelectronic workpiece is described. The method includes receiving a substrate having a working surface exposing a metal layer and having at least one other material exposed or underneath the metal layer; and differentially etching the metal layer relative to the other material by exposing the substrate to a controlled gas-phase environment containing an anhydrous halogen compound.

16 Claims, 4 Drawing Sheets

(56) References Cited

U.S. PATENT DOCUMENTS

| | | | |
|---|---|---|---|
| 2015/0118857 A1 | 4/2015 | Liu et al. | |
| 2015/0345029 A1 | 12/2015 | Wang et al. | |
| 2016/0056167 A1* | 2/2016 | Wang | H01J 37/32357 |
| | | | 257/314 |
| 2016/0211151 A1* | 7/2016 | Tsubota | H01L 21/67248 |
| 2016/0222522 A1 | 8/2016 | Wang et al. | |
| 2017/0207103 A1* | 7/2017 | Kal | H01L 21/67109 |
| 2019/0013211 A1 | 1/2019 | Wang et al. | |
| 2019/0355590 A1* | 11/2019 | Suzuki | H01L 21/768 |

* cited by examiner

GAS PHASE ETCH WITH CONTROLLABLE ETCH SELECTIVITY OF METALS

RELATED APPLICATIONS

This application claims priority to the following provisional application: U.S. Provisional Patent Application Ser. No. 62/875,658, filed Jul. 18, 2019, entitled "GAS PHASE ETCH WITH CONTROLLABLE ETCH SELECTIVITY OF METALS," which is hereby incorporated by reference in its entirety.

FIELD OF INVENTION

The invention relates to a method of etching, and more particularly to a dry non-plasma treatment system and method for chemical and thermal treatment of a substrate.

DESCRIPTION OF RELATED ART

This disclosure relates to fabrication of features in a semiconductor device, including fabrication via etching and deposition processes.

The fabrication of semiconductor devices is a multi-step process of forming structures, i.e., electrical gates, contacts, interconnects, etc., on a semiconductor substrate (wafer) or other substrate. Steps can include material growth, patterning, doping, deposition, etching, metallization, planarization, and so forth. Features formed on a substrate can include various transistors. Transistors can be planar or non-planar, and can also have single gates or multiple gates.

Various etching processes benefit by being able to etch one material relative to another material so that one material is removed, while another material largely remains on the substrate. For example, photoresist has its name in part because it is a photo-sensitive material that resists being etched by dry plasma etching processes. Photoresist materials are conventionally formed into relief patterns which function as etch masks to allow transferring a pattern into one or more underlying materials.

In scaling beyond the 10 nm technology node, the semiconductor device industry is moving towards gate all-around (GAA) device architectures. One fundamental requirement for GAA implementation is the formation of silicon-germanium (SiGe) and silicon (Si) nanowires (NW) or nano-sheets (NS). The fabrication of which requires selective, isotropic, and precise metal etch processes, when forming metal contact to the gate devices.

SUMMARY OF THE INVENTION

Various different materials used in semiconductor fabrication have varying degrees of etch resistivity. In some fabrication schemes it is desirable to have a high degree of etch selectivity between two or more materials for various fabrication steps. In other fabrication schemes, it is desirable to have a uniform etch rate between two chemically different materials. Unfortunately, for a given pair of materials, etch processes can exhibit etch rate ratios that are not desired.

Metals, metalloids, amorphous silicon (a-Si), polycrystalline silicon (poly-Si), and single crystal Si, in conjunction with silicon-germanium (Si—Ge, which is an alloy of silicon and germanium with varying Si:Ge composition) are widely used in the semiconductor industry for different applications. For sub-10 nm technology nodes and beyond, the integration of Si—Ge as a source-drain material has shown potential to improve electrical performance for transistors. Complex process flows for the design and fabrication of three dimensional (3D) Si, Ge, and Si—Ge based field effect transistors (FETs), often have challenging requirements at various fabrication stages. One challenge is to differentially etch metals relative to other materials present on the substrate, e.g., amorphous or crystalline silicon, silicon oxide, silicon nitride, silicon carbide, silicon-germanium alloys, hafnium oxide, or organics, or combinations thereof.

Embodiments of the invention relate to a dry (e.g., gas-phase), non-plasma (e.g., plasma free) treatment system and method for treating a substrate, and more particularly to a dry non-plasma treatment system and method for chemical and thermal treatment of a substrate. Additional embodiments include differential, gas-phase, non-plasma, isotropic etching of various materials. Techniques herein provide a dry isotropic and conformal etch of metals, including W, Ti, TiN, Ta, TaN, Ru, Co, or transition metal, or combinations thereof.

According to one embodiment, a method of etching is described. The method includes receiving a substrate having a working surface exposing a metal layer and having at least one other material exposed or underneath the metal layer; and differentially etching the metal layer relative to the other material by exposing the substrate to a controlled gas-phase environment containing an anhydrous halogen compound.

According to another embodiment, a method for etching is described. The method includes receiving a substrate having a working surface exposing a metal layer and having at least one other material exposed or underneath the metal layer, the metal layer; and differentially removing at least a portion of the metal layer by performing the following: exposing the surface of the substrate to a chemical environment containing an anhydrous halogen compound at a first set-point temperature to chemically alter a surface region of the metal layer, and then, elevating the temperature of the substrate to a second set-point temperature to remove the chemically treated surface region of the metal layer.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION OF SEVERAL EMBODIMENTS

Figure 1A:
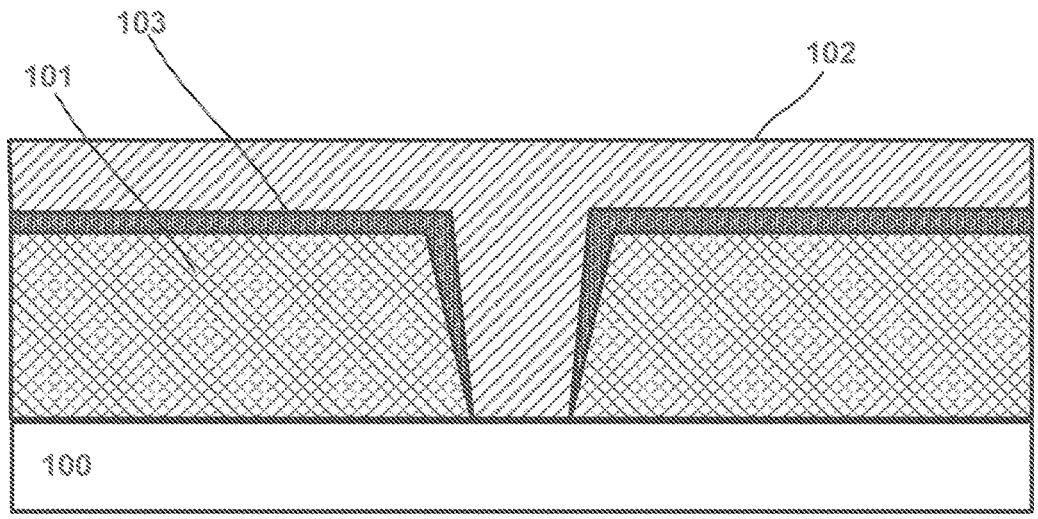
FIGS. 1A and 1B depict a device during an intermediate stage of fabrication.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists.

As used herein, the term "non-plasma" generally means that plasma is not formed in the space proximate the workpiece being treated (i.e., the workpiece is processed or treated within a plasma free environment). While the products of plasma can be introduced from a remote location to the environment proximate the workpiece being treated, plasma is not actively generated by an electromagnetic field adjacent the workpiece.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon workpiece or other bulk workpiece comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The workpiece may be doped or un-doped. Thus, the substrate is not intended to be limited to any particular base structure, underlying layer or overlying layer, patterned or un-patterned, but rather, is contemplated to include any such layer or base structure, and any combination of layers and/or base structures. The description below may reference particular types of workpieces, but this is for illustrative purposes only and not limitation.

As noted above, advanced methodologies are required to address the challenges and meet the demands for aggressive patterning at sub-30 nm technology nodes. And, as also noted, these methodologies present their own set of challenges, which manifest as issues with etch selectivity, rate, profile control, etc. The ability to successfully integrate patterning schemes with highly selective etch processes is paramount to robust pattern transfer.

As an example, once the circuit pattern is initially formed, the patterned material, whether it be a photo-sensitive material patterned using optical lithography, a mechanically imprinted patterned layer, or direct self-assembled layer, among other things, serves as a protective layer that masks some regions of the semiconductor substrate, while other regions are exposed to permit transfer of the circuit pattern to an underlying layer utilizing a dry etching process, such as a plasma etch process.

As previously noted, metals, metalloids, amorphous silicon (a-Si), polycrystalline silicon (poly-Si) and single crystal Si, in conjunction with silicon-germanium (Si—Ge, which is an alloy of silicon and germanium with varying Si:Ge composition) are widely used in the semiconductor industry for different applications. For sub-10 nm technology nodes and below, the integration of Si—Ge as a source-drain material has shown potential to improve electrical performance for transistors. Furthermore, W is a common metal for metal contacts, using Ti, or TiN, or combination thereof as a metal liner. It is desirable in various process steps to differentially remove at least a portion of the metal, including W, Ti, TiN, Ta, TaN, Ru, Co, or transition metal, or combinations thereof.

Referring now to the drawings, wherein like reference numerals designate identical or corresponding parts throughout the several views, FIG. 1A depicts a cross-sectional view of a device during an intermediate stage of fabrication. The device can include a conductive contact, such as a metal contact for a transistor, such as a field-effect transistor (FET) (e.g., pFET or nFET). As an example, the device can include a planar (CMOS) FET, finFET, cFET (complementary FET), gate-all-around (GAA) FET, nano-wire FET, or nano-sheet FET. FIG. 1A provides a representative cross-section of a metal contact. The device is formed on a substrate 100, and includes at least one film 101, e.g., silicon oxide ($SiO_x$), an exposed metal 102, e.g., W, Ru, or Co, and optionally, a metal liner 103, e.g., Ti or TiN. Using processes described herein, at least a portion of the metal layer 102 can be selectively removed relative to the underlying layers, e.g., film 101 and metal liner 103.

Figure 1B:
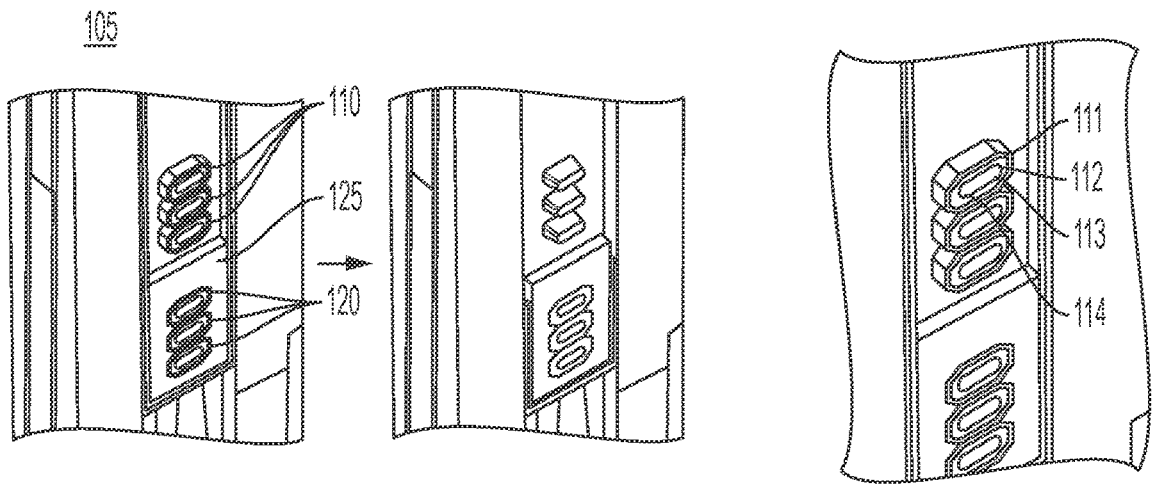

In another example, FIG. 1B depicts a cross-sectional view of a device 105 during an intermediate stage of fabrication. The device 105 can include a conductive contact, such as a metal contact for a transistor, e.g., a GAA-FET. Device 105 can include a first set of nano-sheet structures 110, and a second set of nano-sheet structures 120. Multiple layers of material can be conformally applied to the nano-sheet structures, e.g., a layer 111 (e.g., TiN), and at least one other material 112, 113, 114, e.g., a metal-containing layer 112 (e.g., TaN), a gate dielectric layer 113 (e.g., HfO), and an interfacial layer 114 (e.g., $SiO_2$). Using processes described herein, at least a portion of the first metal-containing layer 111 can be selectively removed from the first set of nano-sheet structures 110, relative to the underlying layers, e.g., the at least one other material 112, 113, 114, while the second set of nano-sheet structures 120 is masked with a mask layer 125.

With reference to FIGS. 1A and 1B, an etching process can be performed to etch or remove a portion of the exposed metal 102 (see FIG. 1A), or first metal-containing layer 111 (see FIG. 1B). Precise etch control is essential for making a metal contact with acceptable electrical properties, and surface roughness conditions, without damaging or eroding the underlying film 101 or liner 103 in FIG. 1A, or second-metal-containing layer 112, gate dielectric layer 113, and interfacial layer 114 in FIG. 1B.

Figure 2:
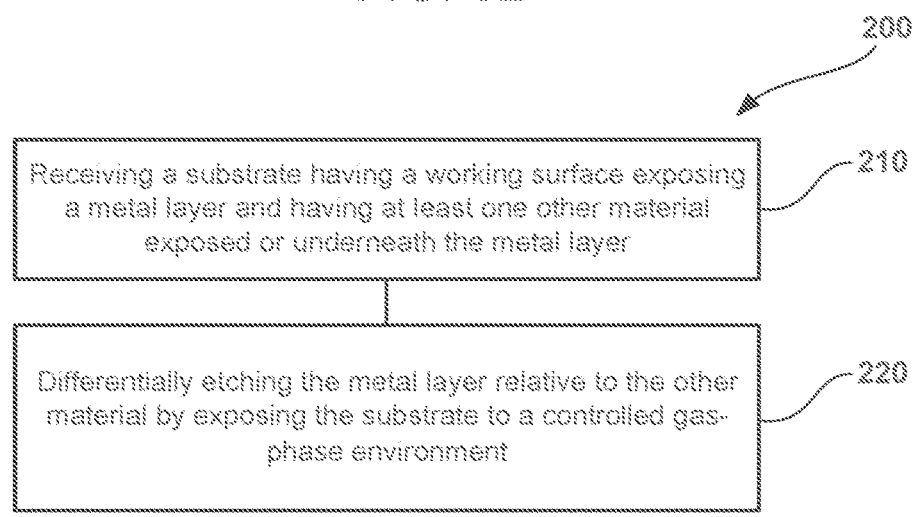
FIG. 2 provides a flow chart illustrating a method of etching according to an embodiment.

As shown in FIG. 2, a method of etching is provided according to an embodiment. The method is presented by way of a flow chart 200 in FIG. 2. As presented in FIG. 2, the flow chart 200 begins in 210 with receiving a substrate 100 having a working surface exposing a metal 102 and having at least one other material 101 and/or 103 exposed or underneath the metal 102. Metal 102 can include W, Ti, TiN, Ta, TaN, Ru, Co, or transition metal, or combinations thereof.

In one embodiment, the metal layer 102 contains W, and the other material 101 and/or 103 includes Ti or TiN. The other material 101 and/or 103 can include an organic material, a silicon-containing material, a germanium-containing material, a titanium-containing material, or a silicon-germanium alloy of the form $Si_xGe_{1-x}$, or combinations of two or more thereof, wherein x is a real number greater than or equal to 0 and less than or equal to 1. For example, the other material 101 and/or 103 can include silicon, silicon oxide, silicon nitride, titanium, titanium nitride, and combinations thereof. In another embodiment, the metal layer 111 contains TiN, and the other material 112, 113, 114 includes a multi-layer structure of TaN, HfO, and $SiO_2$. The other material can further include mask layer 125.

The substrate 100 can include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate 100 can be of any size, for example, a 200 mm (millimeter) substrate, a 300 mm substrate, a 450 mm substrate, or an even larger substrate. The device layers can include any film or device structure into which a pattern can be transferred.

In 220, the metal layer 102, 111, is differentially etched relative to the other material 101, 103, 112, 113, 114 by exposing the substrate to a controlled gas-phase environment containing an anhydrous halogen compound, such as a diatomic halogen (e.g., $F_2$), a nitrogen-halogen compound (e.g., $NF_3$), or an interhalogen compound (e.g., $ClF_3$). In some embodiments, the anhydrous halogen compound does not include nitrogen. The interhalogen compound is a compound composed of two or more different halogen atoms. The interhalogen compound can include at least two elements selected from the group consisting of I, F, Cl, and Br. The interhalogen compound can include at least two elements selected from the group consisting of F, Cl, and Br. The interhalogen compound can include a tetratomic interhalogen. As an example, the interhalogen compound can include $ClF_3$. The gas-phase environment can include mixtures thereof, and can further include a noble gas element, a halide, $N_2$, $H_2$, or $NH_3$, or combinations of two or more thereof. For example, the gas-phase environment can include $F_2$, $NF_3$, $ClF_3$, and mixtures thereof. Additionally, the gas-phase environment can further include effluent from a remote plasma or radical source. Alternatively, the gas-phase environment can consist of $ClF_3$.

When the metal 102, 111 is exposed to the anhydrous halogen containing chemistry, reaction byproducts can be observed. These reaction byproducts have proven to be volatile at temperatures above 80 degrees C. under reduced pressure. The ratio of etch gases to diluent gases can be carefully controlled and modulated to achieve uniform and isotropic etch of the metal 102, 111, per the requirements for device fabrication. Furthermore, the gas pressure inside the chamber enables control of the etch rate to account for throughput, as well as any over etch that may be required. In addition, process parameters, such as temperature and etchant concentration can be carefully modulated to achieve target etch selectivity.

As an example, a gas phase etch can be accomplished by adsorption of $ClF_3$ on the surface at a suitable temperature (e.g., generally between about 35 degrees C. and 130 degrees C., but this temperature can be as high as 300 degrees C.), which activates the surface and drives the metal etch. The reaction rate of different materials is primarily controlled by two factors, namely, (1) the rate of adsorption (e.g., $ClF_3$) on the surface, and (2) the availability or concentration of the etch gases proximate the surface. The concentration of etch gasses can be controlled by tuning the etch gas flow, including the addition of diluents (e.g., $N_2$, Ar, etc.), and chamber pressure. Thereafter, the reaction byproduct can be sublimated by elevating the temperature of the substrate under reduced pressure.

In one embodiment, tungsten (W) can be etched at a greater rate than organic material, silicon-containing material, germanium-containing material, and silicon-germanium alloys of the form $Si_xGe_{1-x}$, wherein x<0.5. In another embodiment, the etch selectivity for tungsten (W) can be tuned relative to Ti, TiN, and silicon-germanium alloys of the form $Si_xGe_{1-x}$, wherein x>0.5. For example, when etching W, and the other material is Ti and/or TiN, relatively lower temperature (i.e., towards 35 degrees C.) causes the W to etch at a faster rate than Ti or TiN (etch selectivity of 10:1, etch rate W:etch rate Ti or TiN), and relatively higher temperature (i.e., towards 130 degrees C.) causes the W to etch at about the same rate as Ti or TiN (etch selectivity of 1:1, etch rate W:etch rate Ti or TiN). In yet another embodiment, TiN can be etched at a greater rate than TaN, HfO, and $SiO_2$.

The etching can further include elevating a temperature of the substrate 100 at or above 60 degrees C., when exposed to the anhydrous halogen, e.g., interhalogen compound. Alternatively, the temperature of the substrate can be elevated to 70 degrees C. or more, or 80 degrees or more.

The etching can further include controlling a temperature of the substrate 100 at a temperature ranging from about −30 degrees C. to about 60 degrees C., when exposed to the anhydrous halogen, e.g., interhalogen compound.

As mentioned above, the etching can further include post-heat treating the substrate at a temperature at or above 80 degrees C., e.g., or at or above 100 degrees C., or 100 degrees C. to 400 degrees C., or 100 degrees C. to 300 degrees C., or greater than 190 degrees C., after exposing the substrate to the anhydrous halogen, e.g., interhalogen compound. The exposing of the substrate to the controlled gas-phase environment containing the anhydrous halogen, e.g., interhalogen compound, and the post-heat treating the substrate can be performed independently in separate process chambers. Alternatively, the exposing of the substrate to the controlled gas-phase environment containing the halogen compound, and the post-heat treating the substrate are performed in the same process chamber.

Other process steps may precede and/or follow the etching step. For example, a clean step or native oxide breakthrough step may be performed to clear the silicon-germanium alloy surface prior to etching. This etching step can include $NH_3$ and/or HF, but other chemistries are contemplated.

At least a portion of the metal layer 102, 111 is selectively removed from the substrate 100 or device 105. For example, the metal layer 102, 111 can be differentially removed relative to the other material. The etching can be performed by placing the substrate 100, or substrate containing device 105, in a tandem chamber etching system, such as the system to be described in FIGS. 3 through 5, or the system described in U.S. Pat. No. 7,029,536, entitled "Processing system and method for treating a substrate" or U.S. Pat. No. 8,303,716, entitled "High throughput processing system for chemical treatment and thermal treatment and method of operating"; or the selective etching can be performed by placing the substrate 100, or substrate containing device 105, in a single chamber etching system, such as the system to be described in FIGS. 6 and 7, or the system described in U.S. Pat. No. 7,718,032, entitled "Dry non-plasma treatment system and method of using"; the entire contents of which are herein incorporated by reference.

According to one embodiment, the differential etching is performed by exposing the surface of the substrate to a chemical environment containing an anhydrous halogen compound, such as an interhalogen compound, at a first set-point temperature to chemically alter a surface region of the metal, and then, elevating the temperature of the substrate to a second set-point temperature to remove the chemically treated surface region of the metal. As an example, the first set-point temperature is at or above 35 degrees C. and at or below 300 degrees C., e.g., at or below 130 degrees C., and the second set-point temperature is at or above 80 degrees C. Furthermore, this process sequence can be repeated in a cyclic fashion to meet etch requirements.

During the exposing, select surfaces of the workpiece, including exposed surfaces of the metal layer 102, 111, are chemically treated by the gas-phase chemical environment. The inventors have observed the chemical alteration of these surface layers to proceed in a self-limiting manner, i.e., the surface is exposed to the chemical environment for a pre-determined amount of time, and the chemical alteration proceeds to a self-limiting depth. A specific material can be targeted and a pre-determined depth can be achieved by selecting various process parameters, including the processing pressure for the chemical environment, the temperature of the workpiece, the temperature of the workpiece holder, the temperature of other chamber components, the composition of the chemical environment, and the absolute and relative flow rates of the gas-phase constituents into the chamber. Upon elevation of the temperature of the workpiece, the chemically altered region of select surfaces of the metal layer 102, 111 is volatilized and removed. During processing these steps may be repeated, as necessary, to etch a target amount of the metal.

As described above the temperature of the substrate holder, or substrate, can be selected to differentially or not differentially remove one material relative to another. In one example, to differentially remove a layer composed of a metal, relative to silicon oxide, silicon nitride, silicon carbide, amorphous carbon, silicon-germanium alloy, titanium, titanium nitride, and organic materials, or other materials, including metals, the first temperature of the substrate holder, or substrate, can exceed 35 degrees C., 60 degrees C., 70 degrees C., or 80 degrees C., or range from 35 degrees C. to 300 degrees C., or 35 degrees C. to 200 degrees C., or 35 degrees C. to 130 degrees C., or 80 degrees C. to 130 degrees C.

In addition to an interhalogen compound, the chemical environment can contain a diatomic halogen, a halide, HF, $NF_3$, $F_2$, $NH_3$, $N_2$, or $H_2$, or a combination of two or more thereof. The chemical environment can further contain a noble element. In other embodiments, the chemical environment can contain an excited specie, a radical specie, or a metastable specie, or any combination of two or more thereof. For example, the dry, non-plasma etch chamber includes a remote plasma generator or remote radical generator arranged to supply the dry, non-plasma etch chamber with excited, radical or metastable specie of a halogen, F, N, or H. The processing pressure can range from 1 mTorr to 5 Torr, or 10 mTorr to 3 Torr, or 50 mTorr to 3 Torr, or 100 mTorr to 3 Torr, or greater than 100 mTorr.

Thereafter, the targeted, chemically altered surface layers are desorbed by elevating the temperature from the first set-point temperature to the second set-point temperature, which may take place in the same chamber or a separate chamber. The second set-point temperature can range from 80 degrees C. to 400 degrees C., or from 80 degrees C. to 300 degrees C., or preferably, the second set-point temperature ranges from 80 degrees C. to 225 degrees C., or preferably, the second set-point temperature ranges from 80 degrees C. to 200 degrees C., or more preferably, the second set-point temperature can be at or above 100 degrees C. to 200 degrees C.

Furthermore, the steps of exposing and elevating can be alternatingly and sequentially performed. From one step to the next, or one cycle to the next, any one or more of the process parameters, including the processing pressure for the chemical environment, the temperature of the workpiece, the temperature of the workpiece holder, the temperature of other chamber components, the composition of the chemical environment, and the absolute and relative flow rates of the gas-phase constituents into the chamber, can be adjusted.

Figure 3:
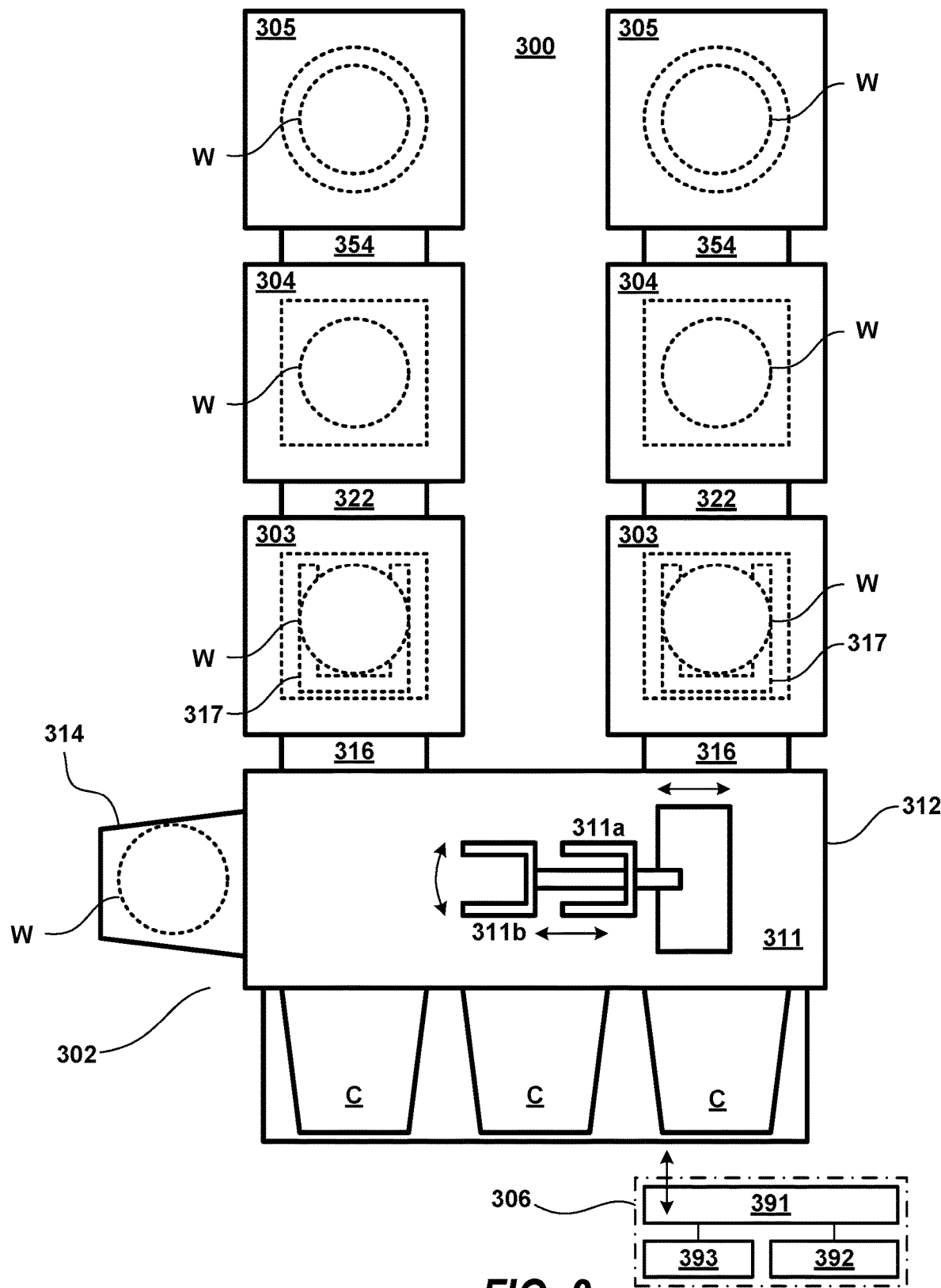
FIG. 3 provides a schematic illustration of a gas-phase etching system according to an embodiment.
Figure 4:
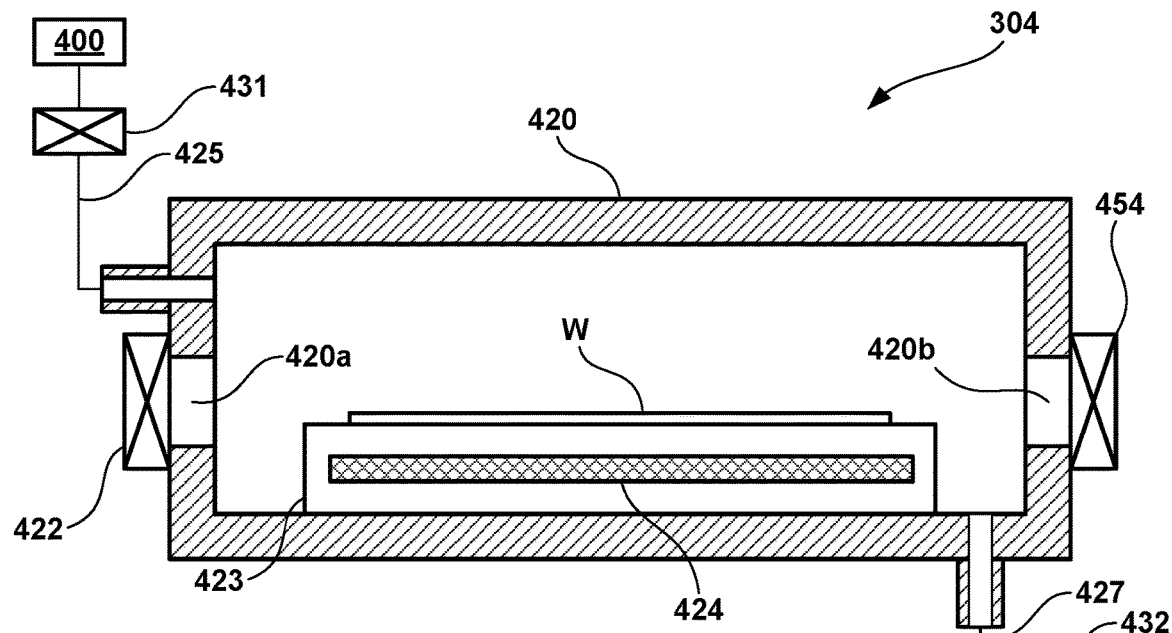
FIG. 4 provides a schematic illustration of a thermal treatment module according to an embodiment.

According to an embodiment, FIG. 3 is a schematic configuration view showing one example of a processing system equipped with an etching system that performs an etching method according to one embodiment of the present disclosure. A processing system 300 includes: a loading/unloading part 302 configured to load and unload a semiconductor substrate (hereinafter simply referred to as a "wafer") W, as a target substrate in which a silicon-germanium alloy and another material coexist; two load lock chambers (L/L) 303 disposed adjacent to the loading/unloading part 302; two heat treatment apparatuses 304 (e.g., thermal treatment chambers) disposed adjacent to the corresponding load lock chambers 303 and configured to perform a heat treatment with respect to the wafer W; two etching apparatuses 305 (e.g., chemical treatment chambers) according to the present embodiment, which are disposed adjacent to the corresponding heat treatment apparatuses 304 and configured to perform etching with respect to the wafer W; and a control part 306.

The loading/unloading part 302 includes a transfer chamber (L/M) 312, within which a first wafer transfer mechanism 311 for transferring the wafer W is installed. The first wafer transfer mechanism 311 includes two transfer arms 311a and 311b configured to hold the wafer W in a substantially horizontal position. A mounting stage 313 is installed at one longitudinal side of the transfer chamber 312. The mounting stage 313 is configured to connect one or more, for example, three, substrate carriers C capable of accommodating a plurality of wafers W. In addition, a substrate orientation device 314 configured to perform a position alignment by rotating the wafer W, and locating reference point thereon is installed adjacent to the transfer chamber 312.

In the loading/unloading part 302, the wafer W is held by one of the transfer arms 311a and 311b, and is moved linearly within a substantially horizontal plane, or moved up and down by the operation of the first wafer transfer mechanism 311, thereby being transferred to a desired position. Further, the wafer W is loaded or unloaded with respect to the carriers C mounted on the mounting stage 313, the orientation device 314, and the load lock chambers 303, as the transfer arms 311a and 311b move toward or away from the substrate carriers C, the orientation device 314 and the load lock chambers 303.

Each of the load lock chambers 303 is connected to the transfer chamber 312 with a gate valve 316 interposed between each of the load lock chambers 303 and the transfer chamber 312. A second wafer transfer mechanism 317 for transferring the wafer W is installed within each of the load lock chambers 303. Each of the load lock chambers 303 is configured such that it can be evacuated to a predetermined vacuum degree.

The second wafer transfer mechanism 317 has an articulated arm structure and includes a pick configured to hold the wafer W in a substantially horizontal position. In the second wafer transfer mechanism 317, the pick is positioned within each of the load lock chambers 303, when an articulated arm is retracted. The pick can reach a corresponding heat treatment apparatus 304 as the articulated arm is extended, and can reach a corresponding etching apparatus 305 as the articulated arm is further extended. Thus, the second wafer transfer mechanism 317 can transfer the wafer W between the load lock chamber 303, the heat treatment apparatus 304, and the etching apparatus 305.

Figure 5:
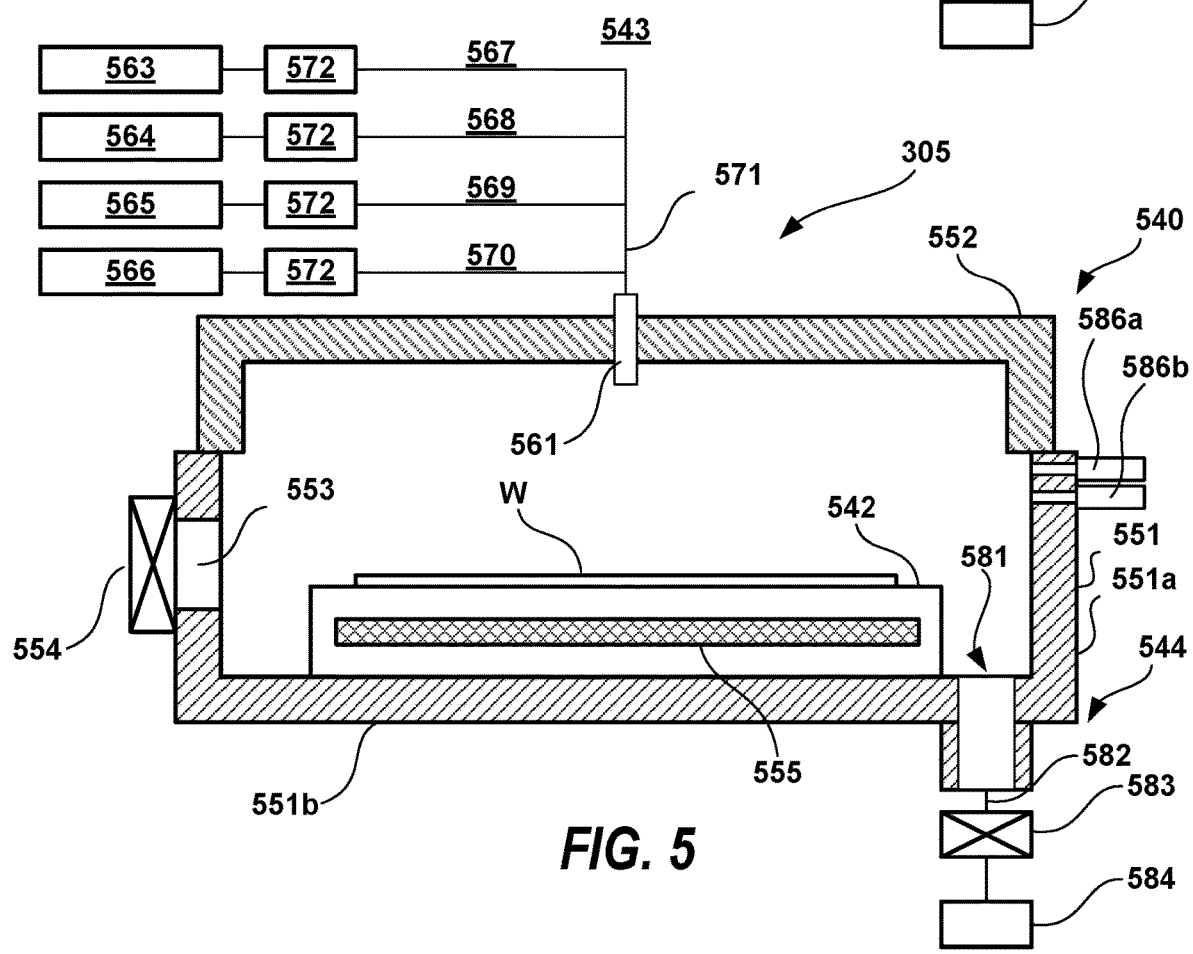
FIG. 5 provides a schematic illustration of a chemical treatment module according to an embodiment.

As shown in FIG. 5, each of the heat treatment apparatuses 304 includes a vacuum-controlled chamber 420, and a mounting table 423 configured to mount the wafer W within the chamber 420. A heater 424 is embedded in the mounting table 423. After being subjected to an etching process, the wafer W is heated by the heater 424, thereby vaporizing and removing etching residue which exists on the wafer W. A loading/unloading gate 420a through which the wafer W is transferred between the heat treatment apparatuses 304 and corresponding load lock chambers 303 is installed in the sidewall of the chamber 420, adjoining the load lock chamber 303. The loading/unloading gate 420a is opened and closed by a gate valve 422. In addition, a loading/unloading gate 420b, through which the wafer W is transferred between the heat treatment apparatuses 304 and corresponding etching apparatuses 305, is installed in the sidewall of the chamber 420 adjoining the etching apparatus 305. The loading/unloading gate 420b is opened and closed by a gate valve 454. A gas supply path 425 is connected to an upper portion of the sidewall of the chamber 420. The gas supply path 425 is connected to an inert gas, i.e., $N_2$, gas supply source 430. An exhaust path 427 is connected to the bottom wall of the chamber 420. The exhaust path 427 is connected to a vacuum pump 433. A flow rate adjusting valve 431 is installed in the gas supply path 425. A pressure adjusting valve 432 is installed in the exhaust path 427. By controlling the flow rate adjusting valve 431 and the pressure adjusting valve 432, the interior of the chamber 420 is kept in an inert, or nitrogen, gas atmosphere having a predetermined pressure. In this state, a heat treatment is performed. Instead of the $N_2$ gas, other inert gases, such as Ar gas or the like, may be used.

The control part 306 includes a process controller 391 provided with a microprocessor (computer) which controls the respective constituent parts of the processing system 300. A user interface 392, which includes a keyboard that allows an operator to perform a command input operation or the like in order to manage the processing system 300, and a display that visualizes and displays an operation status of the processing system 300, is connected to the process controller 391. Also connected to the process controller 391 is a storage part 393, which stores: control programs for realizing, under the control of the process controller, various types of processes performed in the processing system 300, for example, supply of a treatment gas and evacuation of the interior of the chamber in each of the etching apparatuses 305 to be described later; process recipes which are control programs for allowing the respective constituent parts of the processing system 300 to perform specified processes according to process conditions; and various types of databases. The recipes are stored in a suitable storage medium (not shown) of the storage part 393. If necessary, an arbitrary recipe is called out from the storage part 393, and is executed by the process controller 391. In this way, desired processes are performed in the processing system 300 under the control of the process controller 391.

The etching apparatuses 305, according to an embodiment, are configured to perform selective etching of a silicon-germanium alloy, relative to other materials. A detailed configuration of the etching apparatuses 305 will be described later.

In the processing system 300, a wafer including a silicon-germanium alloy and other material are exposed on the wafer W. A plurality of wafers W of this type are loaded within the substrate carriers C, and are transferred to the processing system 300.

In the processing system 300, one of the wafers W is transferred from the substrate carriers C mounted in the loading/unloading part 302 to one of the load lock chambers 303 by one of the transfer arms 311a and 311b of the first wafer transfer mechanism 311, while keeping the atmospheric-side gate valve 316 open, and is delivered to the pick of the second wafer transfer mechanism 317 disposed within the load lock chamber 303.

Thereafter, the atmospheric-side gate valve 316 is closed and the interior of the load lock chamber 303 is evacuated. Subsequently, the gate valve 354 is opened and the pick is extended into a corresponding etching apparatus 305, so that the wafer W is transferred to the etching apparatus 305.

Thereafter, the pick is returned to the load lock chamber 303 and the gate valve 354 is closed. Then, an etching process is performed within the etching apparatus 305 in the manner described below.

After the etching process is completed, the gate valves 322 and 354 are opened. The etched wafer W is transferred to the heat treatment apparatus 304 by the pick of the second wafer transfer mechanism 317. While $N_2$ gas is introduced into the chamber 320, the wafer W mounted on the mounting table 323 is heated by the heater 324, thereby thermally removing etching residue or the like.

After the heat treatment is completed in the heat treatment apparatus 304, the gate valve 322 is opened. The etched wafer W mounted on the mounting table 323 is moved to the load lock chamber 303 by the pick of the second wafer transfer mechanism 318. Then, the etched wafer W is returned to one of the carriers C by one of the transfer arms 311*a* and 311*b* of the first wafer transfer mechanism 311. Thus, a process for one wafer is completed.

In the processing system 300, the heat treatment apparatuses 304 are not essential. In cases where no heat treatment apparatus is installed at the processing system 300, the wafer W after being subjected to the etching process may be moved to one of the load lock chambers 303 by the pick of the second wafer transfer mechanism 317, and then returned to one of the carriers C by one of the transfer arms 311*a* and 311*b* of the first wafer transfer mechanism 311.

Next, the etching apparatus 305 will be described in detail according to an embodiment.

FIG. 5 is a sectional view showing the etching apparatus according to the present embodiment. As shown in FIG. 5, the etching apparatus 305 includes a chamber 540 having a sealed structure. A mounting table 542 configured to mount the wafer W in a substantially horizontal position is installed within the chamber 540. The etching apparatus 305 further includes a gas supply mechanism 543 configured to supply an etching gas to the chamber 540 and an evacuation mechanism 544 configured to evacuate the interior of the chamber 540.

The chamber 540 is configured by a chamber body 551 and a cover portion 552. The chamber body 551 includes a substantially cylindrical sidewall portion 551*a* and a bottom portion 551*b*. The upper portion of the chamber body 551 is opened. This opening is closed by the cover portion 552. The sidewall portion 551*a* and the cover portion 552 are sealed by a seal member (not shown), thereby securing the airtightness of the interior of the chamber 540. A gas introduction nozzle 561 is inserted through the ceiling wall of the cover portion 552 so as to extend from above toward the interior of the chamber 540.

A loading/unloading gate 553 through which the wafer W is loaded and unloaded between the chamber 540 of the etching apparatus 305 and the chamber 420 of the heat treatment apparatus 304 is installed in the sidewall portion 551*a*. The loading/unloading gate 553 is opened and closed by a gate valve 554.

The mounting table 542 has a substantially circular shape (however, the shape can be arbitrary) when viewed from the top, and is fixed to the bottom portion 551*b* of the chamber 540. A temperature controller 555 configured to control the temperature of the mounting table 542 is installed within the mounting table 542. The temperature controller 555 includes a conduit through which a temperature control medium (e.g., water, etc.) circulates. By heat exchange between the mounting table 542 and the temperature control medium flowing through the conduit, the temperature of the mounting table 542 is controlled, and hence, the temperature of the wafer W mounted on the mounting table 542 is controlled.

The gas supply mechanism 543 can include multiple gas supplies 563, 564, 565, 566, for example, including a gas supply for an interhalogen compound. The gas supply mechanism 543 further includes multiple supply lines 567, 568, 569, 570, for example, for pneumatically coupling the gas supplies to one or more gas lines 571 and gas injection nozzles 561.

Flow rate controllers 571 are configured to perform a flow path opening/closing operation, and a flow rate control for each gas supplied to the chamber 540. A shower plate may be installed in the upper portion of the chamber 540 to supply excited gases in a shower-like manner.

The evacuation mechanism 544 includes an exhaust duct 582 connected to an exhaust port 581 formed in the bottom portion 551*b* of the chamber 540. The evacuation mechanism 544 further includes an automatic pressure control valve (APC) 583, which is installed in the exhaust duct 582, and configured to control the internal pressure of the chamber 540, and a vacuum pump 584 configured to evacuate the interior of the chamber 540.

In the sidewall of the chamber 540, two capacitance manometers 586*a* and 586*b*, as pressure gauges for measuring the internal pressure of the chamber 540, are installed such that the capacitance manometers 586*a* and 586*b* are inserted into the chamber 540. The capacitance manometer 586*a* is used to measure a high pressure, while the capacitance manometer 586*b* is used to measure a low pressure. A temperature sensor (not shown) for detecting the temperature of the wafer W is installed near the wafer W mounted on the mounting table 542.

Aluminum is used as the material of the respective constituent parts, such as the chamber 540 and the mounting table 542, which constitute the etching apparatus 305. The aluminum material which constitutes the chamber 540 may be a pure aluminum material or an aluminum material having an anodized inner surface (the inner surface of the chamber body 551, etc.). On the other hand, the surface of the aluminum material which constitutes the mounting table 542 requires wear resistance. Therefore, an oxide film (e.g., $Al_2O_3$ film) having high wear resistance may be applied in some embodiments on the surface of the aluminum material by anodizing the aluminum material.

Figure 6:
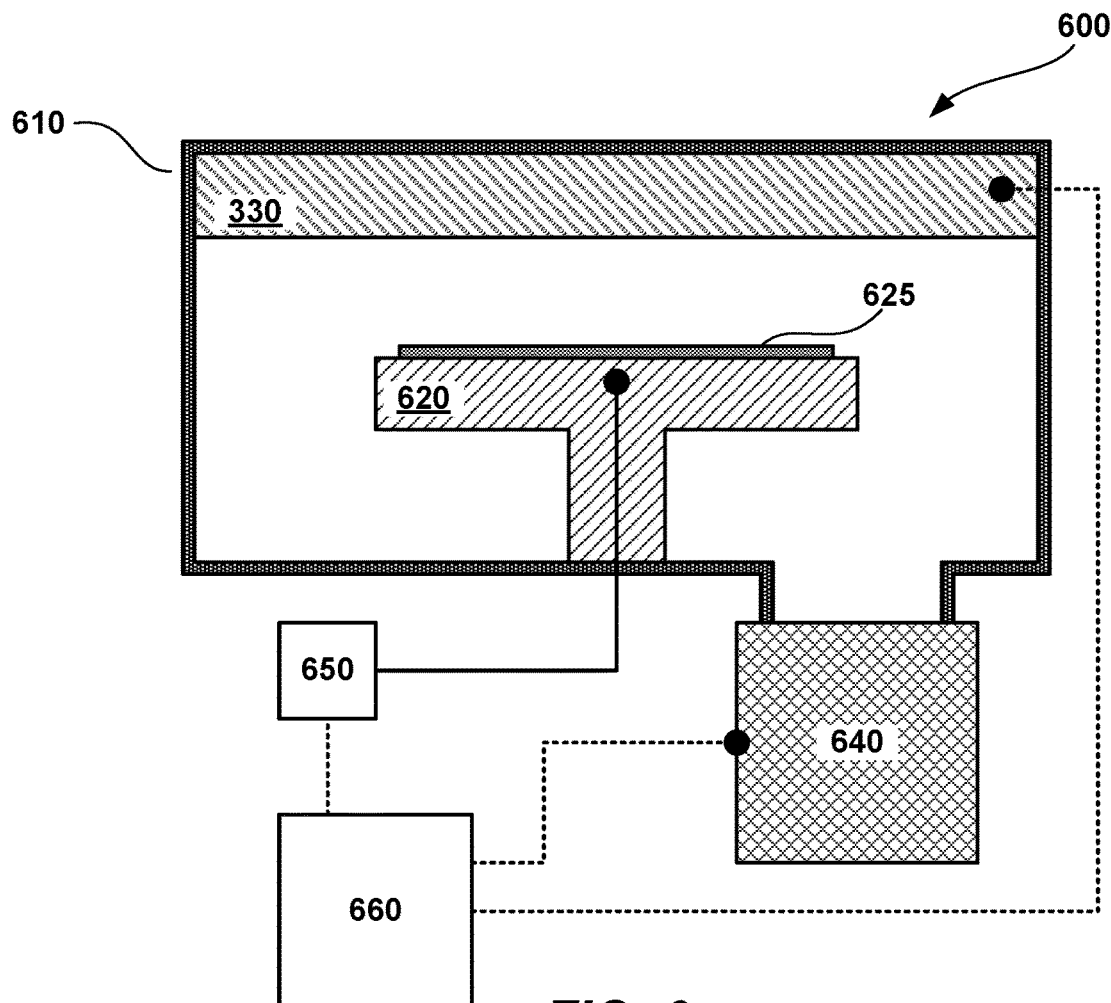
FIG. 6 provides a schematic illustration of an etching system according to another embodiment.

According to another embodiment, the workpiece 100 is placed on a substrate holder in a single chamber etching system (e.g., a dry, non-plasma etch system, or chemical and/or thermal treatment chamber), such as the system described in FIG. 6. The single chamber, etching system is operated to perform the following: (1) exposing the surface of the workpiece to a chemical environment at a first set-point temperature in the range of 50 degrees C. to 100 degrees C., and preferably greater than or equal to 60 degrees C., to chemically alter a surface region of the silicon-germanium alloy 102, and (2) then, elevating the temperature of the workpiece to a second set-point temperature at or above 100 degrees C. to remove the chemically treated surface region of the target layer. The first set-point temperature can range from 50 degrees C. to 300 degrees C., or 50 degrees C. to 200 degrees C., or 50 degrees C. to 100 degrees C., or 70 degrees C. to 90 degrees C., and the second set-point temperature can range from 110 degrees C. to 400 degrees C., or from 110 degrees C. to 300 degrees C., or from 110 degrees C. to 225 degrees C., or greater than or equal to 170 degrees C.

The first set-point temperature can be established by flowing a heat transfer fluid through the workpiece holder at a first fluid set-point temperature. The second set-point temperature can be established by flowing the heat transfer fluid through the workpiece holder at a second fluid set-point temperature. In addition to flowing the heat transfer fluid through the workpiece holder at the second fluid set-point temperature, the substrate holder can be heated by coupling electrical power to at least one resistive heating element embedded within the workpiece holder. Alternatively, in addition to flowing the heat transfer fluid through the workpiece holder at the second fluid set-point temperature, heating the workpiece holder using at least one other heat source separate from the workpiece holder.

According to another embodiment, an etching system 600 for the dry removal of a material on a microelectronic substrate 625 is shown in FIG. 6. The system 600 includes a process chamber 610 for processing substrate 625 in a non-plasma, vacuum environment, a substrate holder 620 arranged within the process chamber 610, and configured to support the substrate 625, a temperature control system 650 coupled to the substrate holder 620, and configured to control the temperature of the substrate holder 620 at two or more set-point temperatures, a gas distribution system 630 coupled to the process chamber 610, and arranged to supply one or more process gases into the process chamber 610, and a controller 660 operably coupled to the temperature control system 650, and configured to control the temperature of the substrate holder 620 ranging from 35 degrees C. to 250 degrees C. For example, the temperature control system 650 can be configured to control the temperature of the substrate holder 620 at a first set-point temperature in the range of 35 degrees C. to 130 degrees C., and adjust and control the temperature of the substrate holder 620 at a second set-point temperature at or above 80 degrees C. Alternatively, for example, the temperature control system 650 can be configured to control the temperature of the substrate holder 620 at a first set-point temperature in the range of 10 degrees C. to 150 degrees C., and adjust and control the temperature of the substrate holder 620 at a second set-point temperature at or above 80 degrees C.

The process chamber 610 can include a vacuum pump 640 to evacuate process gases from process chamber 610. The process chamber 610 can further include a remote plasma generator or remote radical generator arranged to supply the process chamber with excited, radical or metastable species, or combinations thereof.

Gas distribution system 630 can include a showerhead gas injection system having a gas distribution assembly, and one or more gas distribution plates or conduits coupled to the gas distribution assembly and configured to form one or more gas distribution plenums or supply lines. Although not shown, the one or more gas distribution plenums may comprise one or more gas distribution baffle plates. The one or more gas distribution plates further comprise one or more gas distribution orifices to distribute a process gas from the one or more gas distribution plenums to the process chamber 610. Additionally, one or more gas supply lines may be coupled to the one or more gas distribution plenums through, for example, the gas distribution assembly in order to supply a process gas comprising one or more gases. Process gases can be introduced together as a single flow, or independently as separate flows.

Gas distribution system 630 can further include a branching gas distribution network designed to reduce or minimize gas distribution volume. The branching network can remove plenums, or minimize the volume of gas plenums, and shorten the gas distribution length from gas valve to process chamber, while effectively distributing the process gas across the diameter of the substrate 625. In doing so, gases can be switched more rapidly, and the composition of the chemical environment can be changed more effectively.

The volume of the process chamber 610 defining the chemical environment, to which the substrate 625 is exposed, can be reduced or minimized in order to reduce or minimize the residence time or time required to evacuate, displace, and replace one chemical environment with another chemical environment. The time to displace the chemical environment in the process chamber 610 can be estimated as the ratio of the process chamber volume to the pumping speed delivered to the process chamber volume by the vacuum pump 640.

Substrate holder 620 can provide several operational functions for thermally controlling and processing substrate 625. The substrate holder 620 includes one or more temperature control elements configured to adjust and/or elevate a temperature of the substrate 620.

Figure 7:
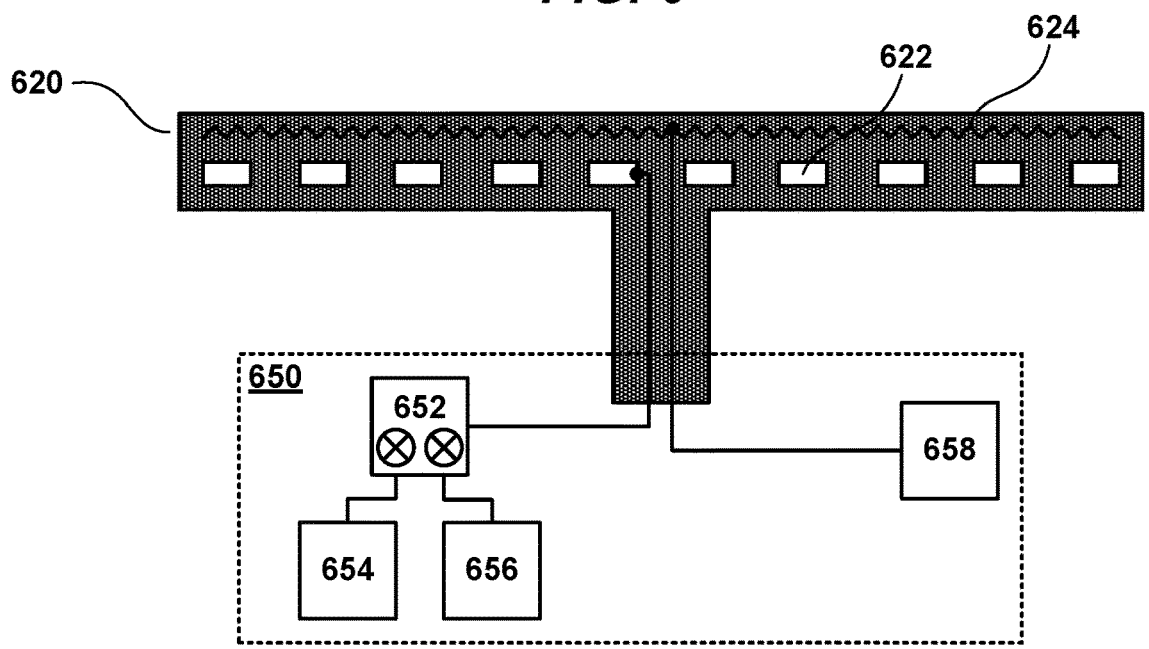
FIG. 7 provides a schematic illustration of a workpiece holder according to an embodiment.

As shown in FIG. 7, substrate holder 620 can include at least one fluid channel 622 to allow flow of a heat transfer fluid there through and alter a temperature of the substrate holder 620. Substrate holder 620 can further include at least one resistive heating element 624. Multi-zone channels and/or heating elements can be used to adjust and control the spatial uniformity of heating and cooling of substrate 625. For example, the at least one resistive heating element 624 can include a central-zone heating element and an edge-zone heating element. Additionally, for example, the at least one fluid channel 622 can include a central-zone fluid channel and an edge-zone fluid channel. At temperatures above 200 to 250 degrees C., other heating systems can be used, including infrared (IR) heating, such as lamp heating, etc.

A power source 658 is coupled to the at least one resistive heating element 624 to supply electrical current. The power source 658 can include a direct current (DC) power source or an alternating current (AC) power source. Furthermore, the at least one resistive heating element 624 can be connected in series or connected in parallel.

The at least one heating element 624 can, for example, include a resistive heater element fabricated from carbon, tungsten, nickel-chromium alloy, aluminum-iron alloy, aluminum nitride, etc. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). According to one example, each of the at least one resistive heating element 624 can include a heating element, commercially available from Watlow Electric Manufacturing Company (12001 Lackland Road, St. Louis, Mo. 63146). Alternatively, or in addition, cooling elements can be employed in any of the embodiments.

A heat transfer fluid distribution manifold 652 is arranged to pump and monitor the flow of heat transfer fluid through the one or more fluid channels 622. The heat transfer fluid distribution manifold 652 can draw heat transfer fluid from a first heat transfer fluid supply bath 654 at a first heat transfer fluid temperature and/or a second heat transfer fluid supply bath 656 at a second heat transfer fluid temperature. Manifold 652 can mix heat transfer fluid from the first and second fluid baths 654, 656 to achieve an intermediate temperature. Furthermore, the heat transfer fluid distribution manifold 652 can include a pump, a valve assembly, a heater, a cooler, and a fluid temperature sensor to controllably supply, distribute, and mix a heat transfer fluid at a predetermined temperature.

In an alternative embodiment, the temperature control system 660 can include a hot wall in close proximity to the work piece holder 620. The substrate holder 620 can further include a substrate clamping system configured to clamp the substrate to the substrate holder, and a backside gas supply system configured to supply a heat transfer gas to the backside of the substrate.

The heat transfer fluid can include a high temperature fluid having a boiling point exceeding 200 degrees C. For example, the heat transfer fluid can include Fluorinert™ FC40 (having a temperature range of −57 to 165 degrees C.), or Fluorinert™ FC70 (having a temperature range of −25 to 215 degrees C.), commercially available from 3M.

Substrate holder 620 can be monitored using a temperature sensing device, such as a thermocouple (e.g. a K-type thermocouple, Pt sensor, etc.) or optical device. Furthermore, the substrate holder temperature control system 650 may utilize the temperature measurement as feedback to the substrate holder 620 in order to control the temperature of substrate holder 620. For example, at least one of a fluid flow rate, a fluid temperature, a heat transfer gas type, a heat transfer gas pressure, a clamping force, a resistive heater element current or voltage, a thermoelectric device current or polarity, etc. may be adjusted in order to affect a change in the temperature of substrate holder 620 and/or the temperature of the substrate 625.

As noted above, controller 660 is operably coupled to the temperature control system 650, and configured to control the temperature of various components in etching system 600, including the substrate holder 620, at temperatures ranging from 10 degrees C. to 250 degrees C., or 35 degrees C. to 250 degrees C., or 50 degrees C. to 250 degrees C. For example, under instruction of controller 660, the temperature control system 650 can be configured to control the temperature of the substrate holder 620 at a first set-point temperature in the range of 35 degrees C. to 100 degrees C., and adjust and control the temperature of the substrate holder 320 at a second set-point temperature at or above 100 degrees C. (see process recipes described above). The temperature control system 650 can obtain temperature information from one or more temperature sensors arranged to measure the temperature of the substrate holder 620, the substrate 625, the chamber wall of the process chamber 610, or the temperature of the gas distribution system 630, among others, and utilize the temperature information to controllably adjust these temperatures.

As an example, when changing the temperature of the substrate holder 620 from the first set-point temperature, in the range of 35 degrees C. to 100 degrees C., to the second set-point temperature, at or above 100 degrees C., the fluid temperature of the heat transfer temperature can be adjusted rapidly by changing the ratio of heat transfer fluid drawn from the heat transfer fluid supply baths 654, 656. Once within a predetermined range of the targeted second set-point temperature, the at least one resistive heating element can be utilized to accurately control the set-point temperature. The substrate holder 620 can be designed to have a relatively low thermal mass. For example, the thickness of the holder and material composition of the holder can be designed to reduce or minimize the thermal mass of the holder. Furthermore, the at least one fluid channel 622, including the fluid conduits supplying heat transfer fluid to the at least one fluid channel 622, can be designed to have low volume in order to change fluid temperature rapidly. For example, the length and diameter of the fluid channels and conduits can be designed to reduce or minimize volume (i.e., reduce the time necessary to displace fluid of one temperature, and replace it with fluid of another temperature).

Other chamber components of process chamber 610, including chamber walls, the gas distribution system 630, etc., can include heating and/or cooling elements to control the temperature thereof. For example, the chamber wall temperature of the process chamber 610 and the temperature of at least a portion of the gas distribution system can be controlled to a temperature up to 150 degrees C., or within the range 50 degrees C. to 150 degrees C. (preferably, 70 degrees C. to 110 degrees C.).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching, comprising:
receiving a substrate having a working surface exposing a metal layer and having at least one other material exposed or underneath the metal layer, the metal layer containing W, Ti, TiN, Ta, TaN, Ru, Co, or a transition metal, or combinations thereof; and
differentially etching the metal layer relative to the at least one other material by exposing the substrate to a gas-phase environment containing an anhydrous halogen compound, the differentially etching including
elevating a temperature of the substrate at or above 35 degrees C. and at or below 130 degrees C., when exposed to the anhydrous halogen compound, and
post-heat treating the substrate at a temperature at or above 170 degrees C. after exposing the substrate to the anhydrous halogen compound,
wherein the metal layer contains W, and the at least one other material includes Ti or TiN.

2. The method of claim 1, wherein the anhydrous halogen compound includes a diatomic halogen, or an interhalogen compound, or a combination thereof.

3. The method of claim 2, wherein the interhalogen compound includes a tetratomic interhalogen.

4. The method of claim 1, wherein the anhydrous halogen compound includes $F_2$, or $ClF_3$, or a combination thereof.

5. The method of claim 1, wherein the gas-phase environment further includes a nitrogen-containing gas.

6. The method of claim 1, wherein the gas-phase environment further includes a noble gas element, HF, $NF_3$, $NH_3$, effluent from a remote plasma source, or combinations of two or more thereof.

7. The method of claim 1, wherein the at least one other material includes organic material, silicon-containing material, germanium-containing material, or silicon-germanium alloys of the form $Si_xGe_{1-x}$, or combinations of two or more thereof, and wherein x is a real number greater than 0.5.

8. The method of claim 7, wherein the silicon-containing material includes silicon, silicon oxide, silicon nitride, and combinations thereof, and wherein the germanium-containing material includes germanium, germanium oxide, germanium nitride, and combinations thereof.

9. The method of claim 1, wherein the exposing the substrate to the gas-phase environment containing the anhydrous halogen compound, and the post-heat treating the substrate are performed independently in separate process chambers.

10. The method of claim 1, wherein the exposing the substrate to the gas-phase environment containing the anhydrous halogen compound, and the post-heat treating the substrate are performed in the same process chamber.

11. A method of etching, comprising:
receiving a substrate having a working surface exposing a metal layer and having at least one other material exposed or underneath the metal layer, the metal layer containing W, Ti, TiN, Ta, TaN, Ru, Co, or a transition metal, or combinations thereof; and
differentially removing at least a portion of the metal layer by performing the following:
(i) exposing the surface of the substrate to a chemical environment containing an anhydrous halogen compound at a first set-point temperature at or above 35 degrees C. to chemically alter a surface region of the metal layer, and (ii) after the exposing, elevating the temperature of the substrate to a second set-point temperature at or above 170 degrees C. to remove the chemically treated surface region of the metal layer, the method further comprising: varying the first set-point temperature to alter the etch selectivity between the metal layer and the at least one other material.

12. The method of claim 11, wherein the anhydrous halogen compound includes a diatomic halogen, or an interhalogen, or a combination thereof.

13. The method of claim 12, wherein the interhalogen compound includes $ClF_3$.

14. A method of etching, comprising:
receiving a substrate having a working surface exposing a metal layer and having at least one other material exposed or underneath the metal layer, the metal layer containing W, Ti, TiN, Ta, TaN, Ru, Co, or a transition metal, or combinations thereof; and
differentially etching the metal layer relative to the at least one other material by exposing the substrate to a gas-phase environment containing an anhydrous halogen compound, the differentially etching including
exposing the substrate to the anhydrous halogen compound with a temperature of the substrate in a range of at or above 35 degrees C. and at or below 130 degrees C., and
after the exposing, increasing temperature of the substrate to perform a post-heat treating of the substrate at a temperature in a range from 100 degrees C. to 300 degrees C.,
the method further including, prior to the differentially etching, exposing the substrate to at least one of $NH_3$ or HF.

15. The method of claim 14, wherein the metal layer contains W and the at least one other material includes Ti or TiN.

16. The method of claim 14, wherein the post-heat treating temperature is in a range from 110 degrees C. to 225 degrees C.

* * * * *